(12) United States Patent
Tehrani

(10) Patent No.: US 7,222,403 B2
(45) Date of Patent: May 29, 2007

(54) PAD GRIPPING AND REMOVAL APPARATUSES

(75) Inventor: Omid Tehrani, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 208 days.

(21) Appl. No.: 10/928,862

(22) Filed: Aug. 26, 2004

(65) Prior Publication Data

US 2006/0042426 A1   Mar. 2, 2006

(51) Int. Cl.
*B23P 19/04* (2006.01)

(52) U.S. Cl. ........................................................ 29/239

(58) Field of Classification Search .................. 29/239, 29/281.5; 269/93, 239, 259 CS, 282; 242/532.5, 242/532.6, 532.7, 402, 405, 405.1, 579, 586
See application file for complete search history.

(56) References Cited

U.S. PATENT DOCUMENTS

| | | | | | |
|---|---|---|---|---|---|
| 3,144,218 | A | * | 8/1964 | Tepe | 242/378.2 |
| 4,306,709 | A | * | 12/1981 | Hurn | 269/75 |
| 4,962,901 | A | * | 10/1990 | Shirley et al. | 242/323 |
| 5,388,778 | A | * | 2/1995 | Morimoto | 242/261 |
| 6,012,665 | A | * | 1/2000 | Olona | 242/250 |

\* cited by examiner

*Primary Examiner*—Robert C. Watson
(74) *Attorney, Agent, or Firm*—Schwabe, Williamson & Wyatt, P.C.

(57) ABSTRACT

Apparatuses and methods for gripping a pad are disclosed.

13 Claims, 10 Drawing Sheets

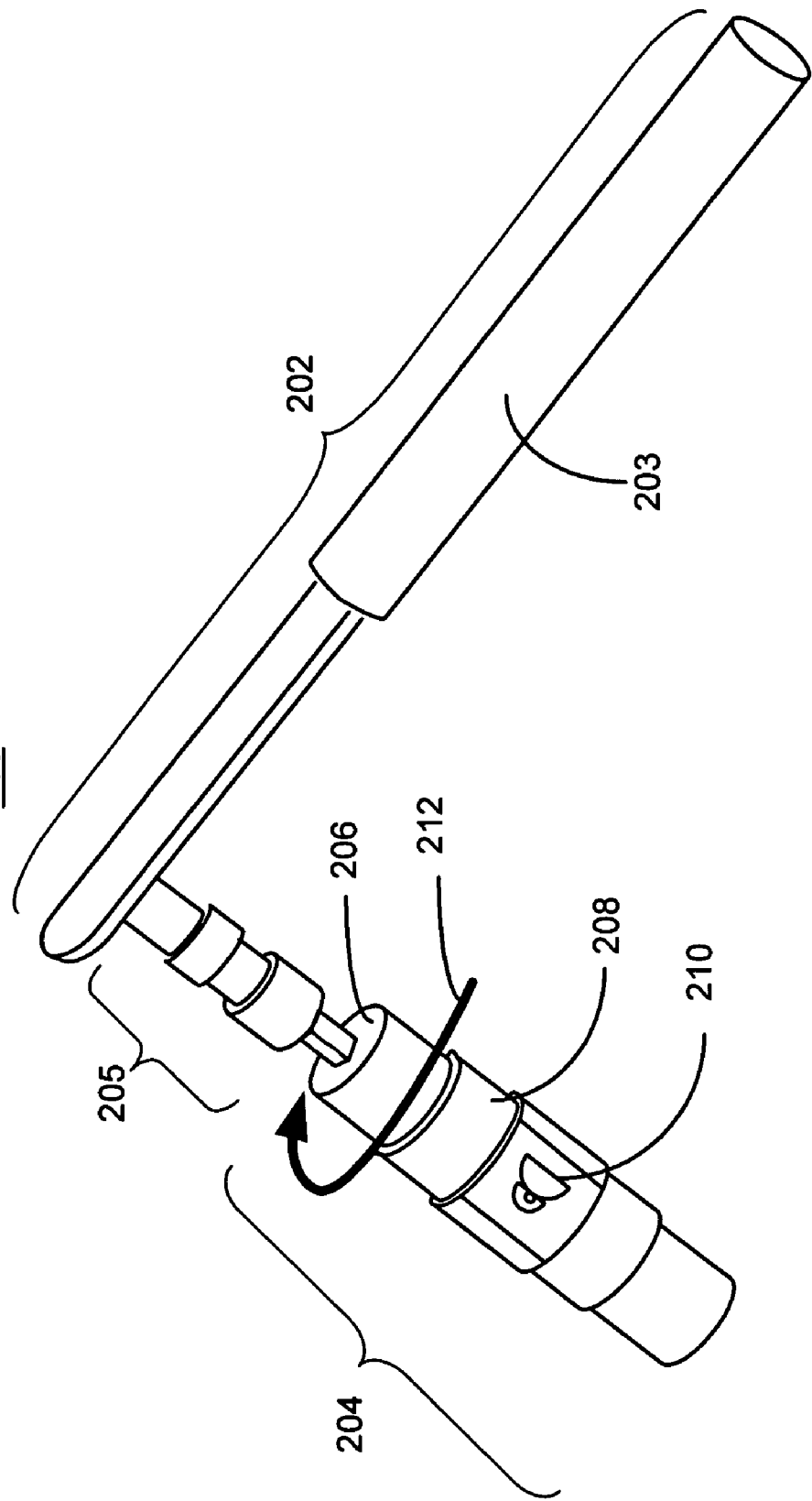

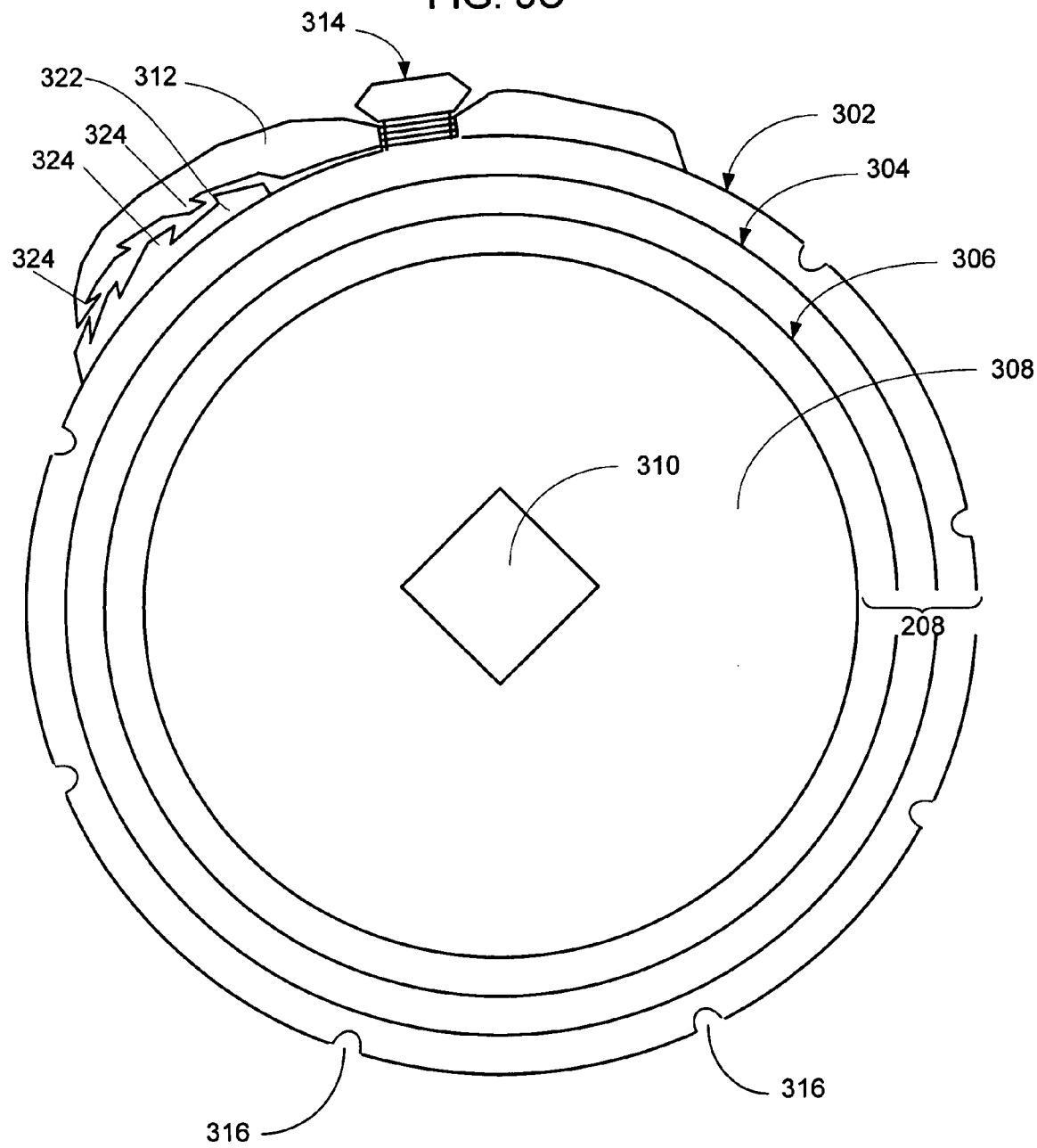

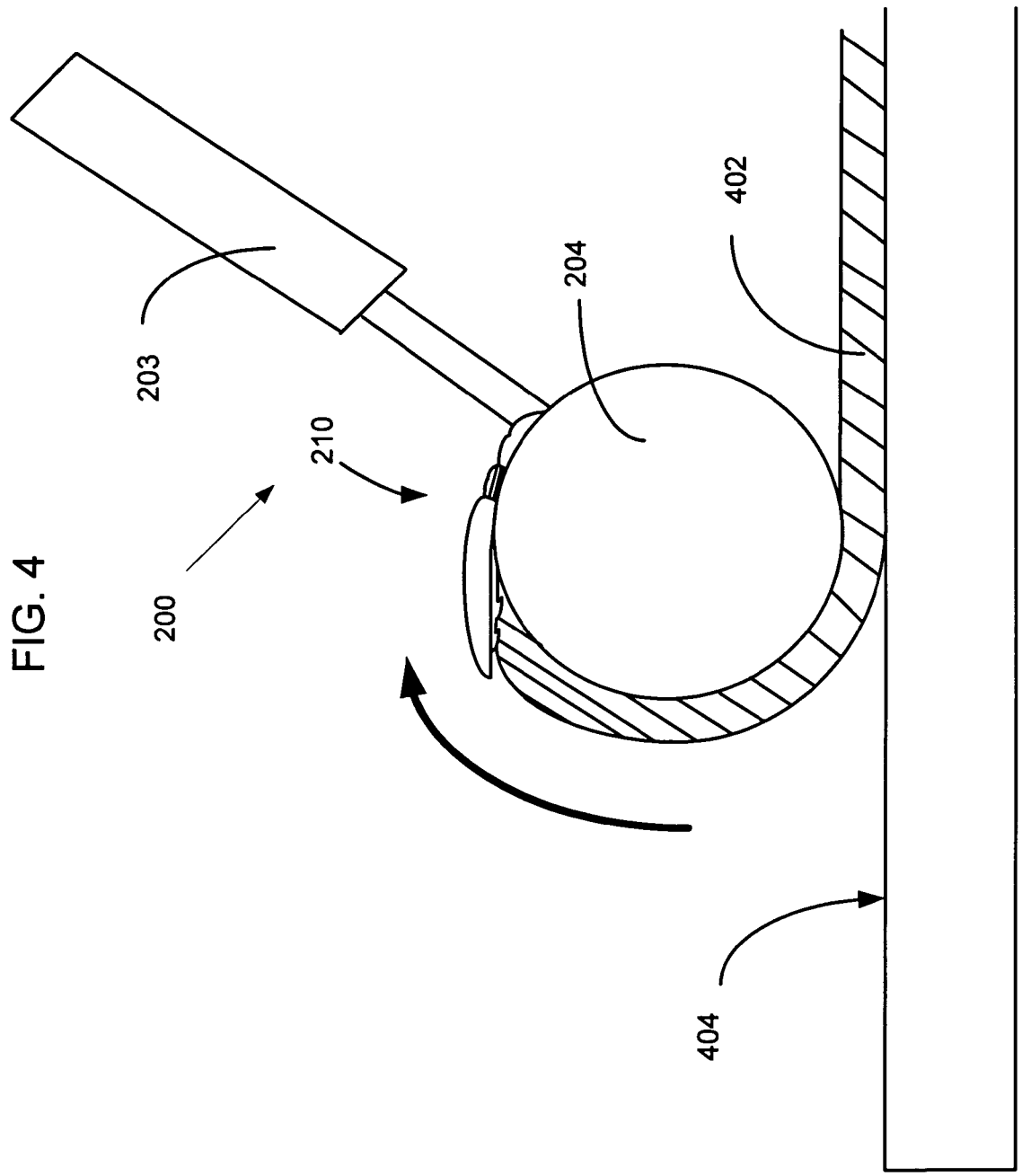

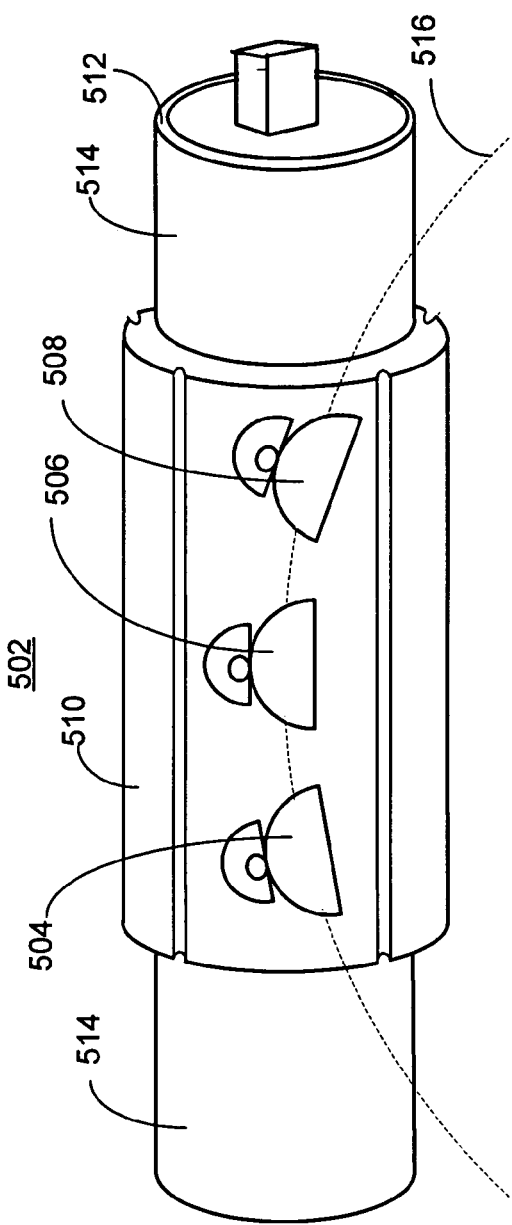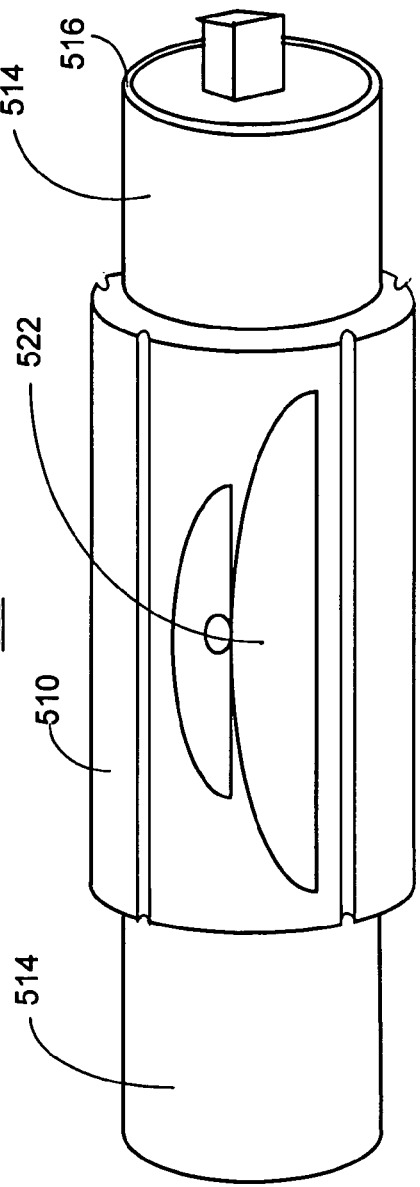

PAD GRIPPING AND REMOVAL APPARATUSES

BACKGROUND OF THE INVENTION

1. Field of the Invention

Embodiments of the present invention relate to, but are not limited to, tools, and in particular, to the field of electronic device manufacturing tools.

2. Description of Related Art

In the field of electronic device manufacturing, semiconductor wafers typically undergo a process known as chemical mechanical polishing (CMP) process. In order to undertake such a process, a machine known as a CMP polisher is often employed. During the CMP process, the CMP polishing machine is used to planarize the surfaces of the wafers being processed. FIG. 1 depicts an exemplary prior art CMP polishing machine that may be used in a CMP process. The CMP polishing machine 100 includes, among other things, a polisher arm and wafer carrier 102, a control panel 104, a load station 106, an unload station 108, a platen 110, and a polishing pad 112. In a CMP process, a wafer 114 is typically retrieved from the load station 106 and coupled to the polisher arm and wafer carrier 102. During the process, the carrier 102 lowers the wafer 114 so that it contacts the polishing pad 112 facedown. The wafer 114 is than rotated on the polishing pad 112 planarizing the wafer 114. After the completion of the polishing process, the planarized wafer is deposited into the unload station 108.

The polishing pad 112, which is disposed on the platen 110 is typically made of a polymeric material such as filled polyurethane or Dacron™ felt. Although not depicted, the platen 110 may sometimes further include a suba pad that is disposed on top of the platen 110 between the polishing pad 112 and the platen 110. The polishing pad 112 may be secured to the platen 110 by an adhesive such as a polymer adhesive. Polishing pads typically have sponge cake like qualities having a number of air pockets and channels on the surface of the pads. Since polishing pads tend to wear out after prolong use, they must be replaced on a regular basis.

Presently, the polishing pads that are used in CMP polishing machines are physically removed from the platen 110 by hand, which tends to be a time-consuming and physically demanding task. That is, because of the way the polishing pads are attached to the underlying surface (e.g., platen surface) and the inherent characteristics of the pads (e.g., sponge-like), they must be removed delicately but with a relatively considerable amount of force. Further, the amount of working space available to remove the polishing pad 112 from the platen 110 may be quite limited depending upon the CMP polishing machine 100 being used.

BRIEF DESCRIPTION OF DRAWINGS

The present invention will be described by way of exemplary embodiments, but not limitations, illustrated in the accompanying drawings in which like references denote similar elements, and in which:

FIG. 2 illustrates a tool that includes a gripper socket assembly for removing an adhesively secured pad in accordance with some embodiments;

FIG. 3C illustrates a side view of the gripper socket assembly of FIG. 3A in accordance with some embodiments;

FIG. 4 illustrates the tool of FIG. 2 being used to remove a pad from an underlying surface in accordance with some embodiments;

FIGS. 5A and 5B illustrate gripper socket assemblies in accordance with some embodiments;

DETAILED DESCRIPTION OF ILLUSTRATIVE EMBODIMENTS

Figure 1:
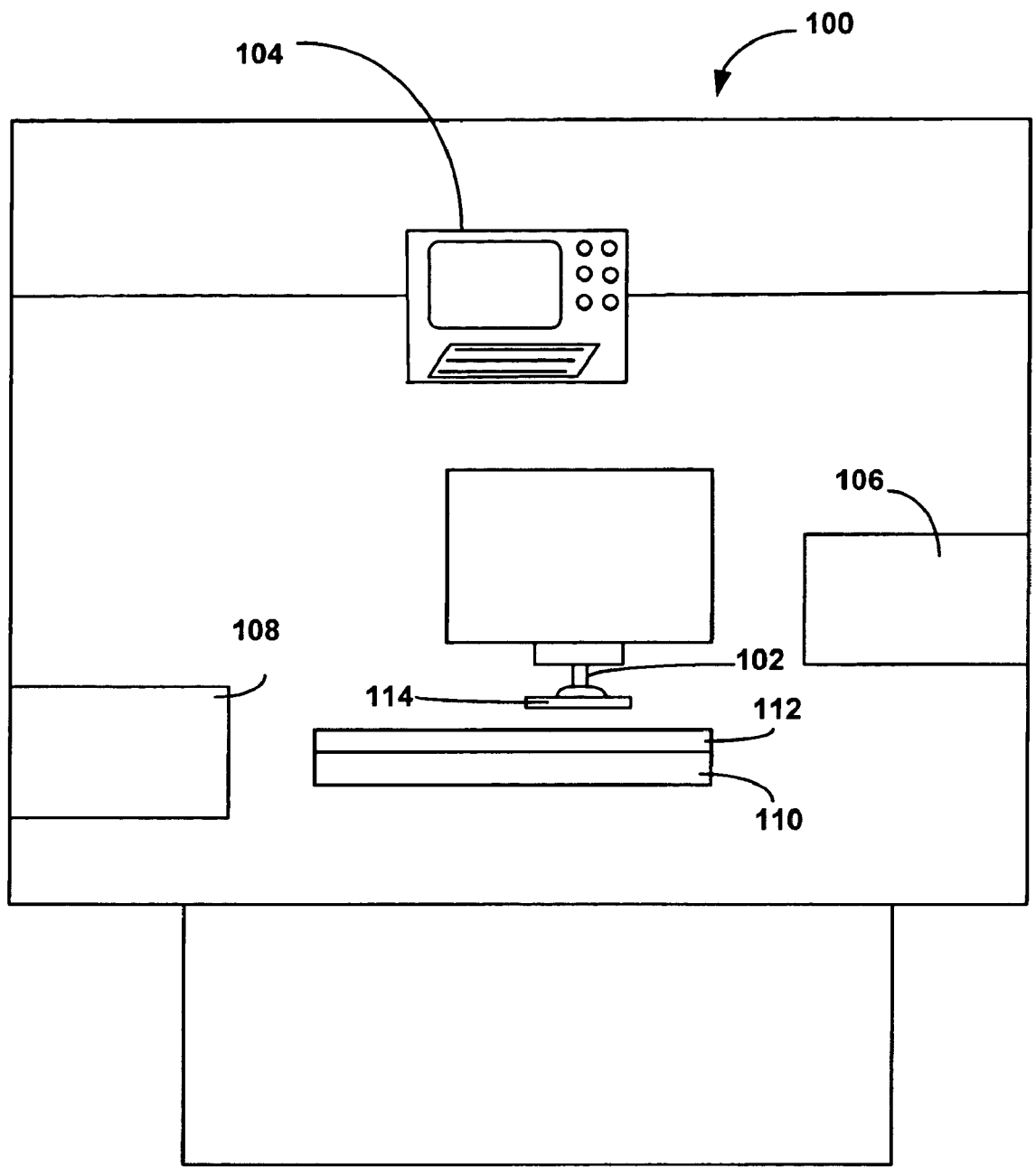
FIG. 1 illustrates an exemplary chemical mechanical polishing (CMP) machine.

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention.

The following description includes terms such as on, onto, on top, underneath, underlying, downward, lateral, and the like, that are used for descriptive purposes only and are not to be construed as limiting. That is, these terms are terms that are relative only to a point of reference and are not meant to be interpreted as limitations but are instead, included in the following description to facilitate understanding of the various aspects of the invention.

According to various embodiments of the invention, an apparatus for facilitating the detachment and removal of a pad that has been adhesively attached to an underlying surface is provided. For the embodiments, the pad may be a polishing pad that may be used in a CMP polishing machine and the underlying surface may be the surface of a platen.

In various embodiments, the apparatus may be a gripper socket assembly. For these embodiments, the gripper socket assembly may be attached to a tool handle or a motor. The gripper socket assembly may include a gripper component that "grasps" or "grips" at least a portion of the pad being removed to the gripper socket assembly. The gripper socket assembly may further include a rotatable cylindrical member and a clutch assembly. The clutch assembly may restrict the amount of torque that may be applied to the gripper socket assembly thus preventing too much torque from being applied to a pad when the gripper socket assembly is used in, for example, a pad removal operation. The presence of the clutch assembly may also improve safety to those using the gripper socket assembly in some embodiments.

In various embodiments, the cylindrical member of the gripper socket assembly may have one or more features that facilitate the removal of the pad from the gripper socket assembly once an operation to remove a pad from an underlying surface has been completed. For these embodiments, the cylindrical member may include a plurality of exterior surfaces that may limit the amount of cylindrical member surface area that the pad comes in contact with. In addition, the cylindrical member surface that is to be in contact with the pad may further include grooves to further facilitate the removal of the pad from the gripper socket assembly.

In some embodiments, the apparatus may be a complete tool that is comprised of a gripper socket assembly and a handle or a motor that may be attached to the gripper socket assembly. For these embodiments, the handle or the motor may be used to apply torque to the gripper socket assembly. The torquing action may result in the gripper socket assembly, which may be secured to at least a portion of a pad to be removed, to rotate causing the pad to roll onto and wrap around the gripper socket assembly.

FIG. 2 depicts a hand tool for removing an adhesively secured pad in accordance with some embodiments. For the embodiments, the tool 200 includes a handle portion 202 and a rotatable gripper socket assembly 204. The handle portion 202 includes a handle 203 and an arm 205 that is coupled to a clutch assembly (not shown) located within a clutch assembly cover 206. The clutch assembly is further located within or housed in a cylindrical member 208 of the gripper socket assembly 204. On the exterior of the cylindrical member 208 is a gripper 210.

In various embodiments, the handle portion 202 may be used to apply a torquing motion to the gripper socket assembly 204 as indicated by ref. 212. For these embodiments, a user may grip the handle 203 and apply a circular torquing motion to the gripper socket assembly 204 via the arm 205. In some embodiments, extensions may be added to the arm 205 or the arm 205 may be extended to assure that the handle portion 202 is clear of the pad (as well as the underlying surface) that is to be wrapped around the gripper socket assembly 204 during a pad removal operation.

The cylindrical member 208 may be the axle of the gripper socket assembly 204. In general, the cylindrical member 208 may be made of a rigid material and may transfer the rotational force generated from, for example, the handle portion 202 and through the clutch assembly and to the cylindrical member 208 during a pad removal operation. In these embodiments, the cylindrical member 208 may have multiple surfaces, each of the surfaces defined by different diameters (to be discussed in greater detail below). In other embodiments, however, the cylindrical member 208 may not have multiple surfaces that are defined by different diameters but instead, may include a single surface that is defined by a constant or a varying diameter.

In various embodiments, the gripper 210 may grip at least a portion of a pad such as a polishing pad to the gripper socket assembly 204 during a pad removal operation. By securing at least a portion of the pad to the gripper socket assembly, the pad may be wrapped around the gripper socket assembly 204 when a torquing motion applied through the handle portion 202 rotates the gripper socket assembly 204.

In various embodiments, the clutch assembly (see FIG. 3D) that may be contained within the cylindrical member 204 may allow the tool 200 to be operated in a manner similar to a socket wrench. For example, the clutch assembly may allow only the torque generated from a clockwise motion of the handle portion 202 to be transferred to the gripper socket assembly 204 but may not allow the torque from a counterclockwise motion of the handle portion 202 to be transferred to the gripper socket assembly 204.

In some embodiments, the clutch assembly housed in the cylindrical member 208 may limit the amount of torque that can be applied to the rotating gripper socket assembly 204. For example, during a pad removal operation, a torque limit may prevent the pad being removed from being torn apart by limiting the amount of torque that can be used on the pad to lift and separate the pad from the underlying surface. Further, the maximum torque limitation of the clutch assembly may increase safety to the tool user by restricting the amount of torque that can be applied to the gripper socket assembly 204.

In various embodiments, the tool 200 may be used to remove a pad that has been adhesively attached to an underlying surface. For these embodiments, the pad may be a polishing pad and the underlying surface may be the surface of a platen. In order to remove the polishing pad from the platen, the gripper socket assembly 204 may be initially placed at the edge of the polishing pad. The edge of the polishing pad may then be inserted into the gripper 210, which grabs or secures at least the portion of the polishing pad that has been inserted into the gripper 210. After securing the edge of the pad to the gripper socket assembly 204, the handle portion 202 may be rotated applying torque to the gripper socket assembly 204. As a result of the torque being applied to the gripper socket assembly 204, the gripper socket assembly 204 may rotate resulting in the polishing pad wrapping around the gripper socket assembly 204. Once the pad removal operation has been completed, the pad may be removed from the gripper socket assembly 204 in subsequent operations.

Figure 3A:
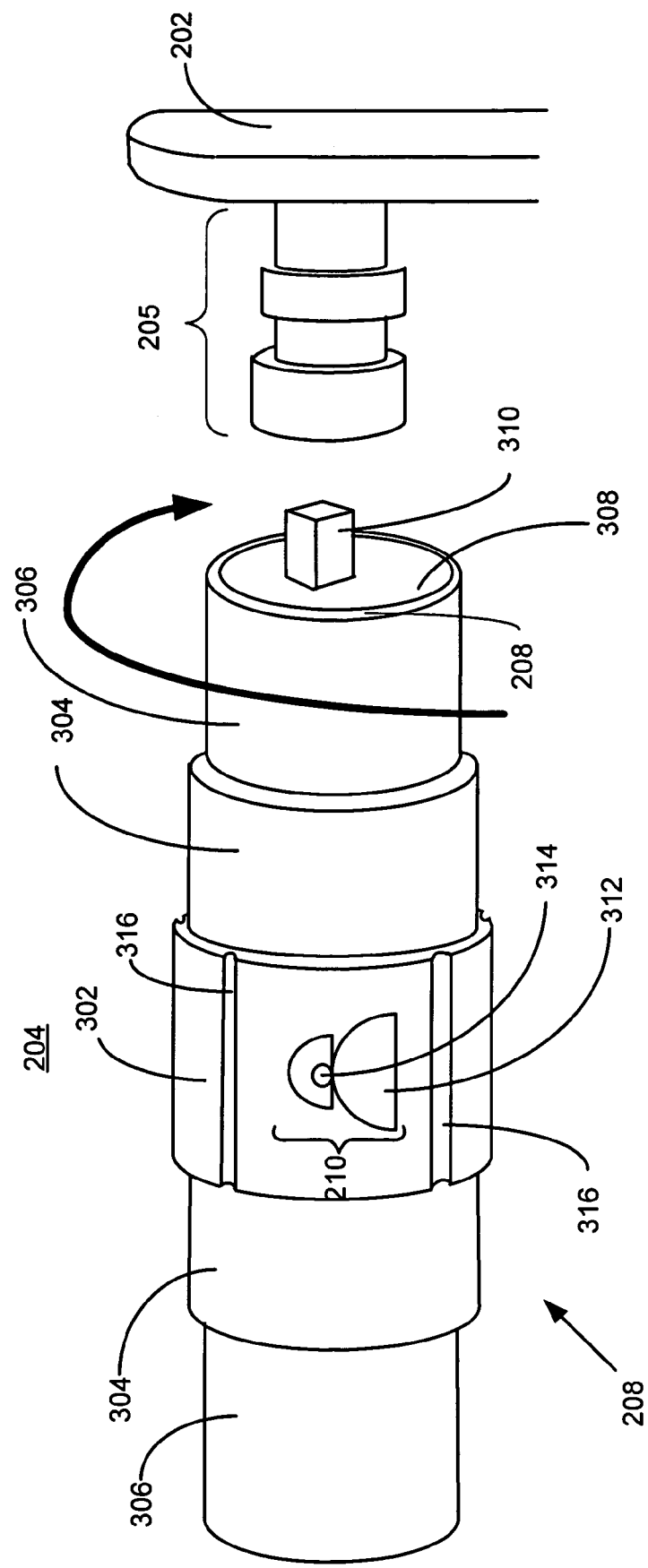
FIG. 3A illustrates the gripper socket assembly of FIG. 2, in further detail, in accordance with some embodiments.

FIG. 3A depicts the gripper socket assembly of FIG. 2 in accordance with some embodiments. For the embodiments, the gripper socket assembly 204 may be a detachable component that may be attached to an arm of a handle or a motor. For the embodiments, the gripper socket assembly 204 includes a gripper 210 that is attached to the exterior surface of the cylindrical member 208. The exterior surface of the cylindrical member 208 includes three surfaces, a first (innermost) exterior surface 302, a second (middle) exterior surface 304 and third (outermost) exterior surface 306, that are defined by diminishing diameters, the outermost third exterior surface 306 being defined by the smallest diameter while the innermost first exterior surface 302 defined by the largest diameter. Note that in other embodiments, the cylindrical member 208 may not be comprised of multiple exterior surfaces (e.g., surfaces 302, 304 and 306) defined by different diameters but may be comprised of a single exterior surface defined by a constant or varying diameter. At the end of the cylindrical member 208 is a clutch assembly cover 308 that may house the clutch assembly (not shown—see FIG. 3D). Attached to the clutch assembly and adjacent to the clutch assembly cover 308 is a wrench attachment 310. The wrench attachment 310 may be used to couple with an arm 205 of a handle portion 202 or a motor. Although the wrench attachment 310 in these embodiments is depicted as being a block, the wrench attachment 310 may be any type of attachment component that may be used for such purposes. These include, for example, a hole to insert the arm 205 of the handle portion 202 or other attachment components that can be used for coupling purposes.

According to various embodiments, on the first exterior surface 302 of the cylindrical member 208 is a gripper 210. For these embodiments, the gripper 210 may include an upper gripper jaw 312 and a gripper spring mechanism 314. Along the first exterior surface 302 are grooves 316. When the gripper socket assembly 204 is used in, for example, a pad removal operation, at least a portion of the pad being removed may be secured to the gripper socket assembly 204 by inserting the edge of the pad into the upper gripper jaw 312 and a lower gripper jaw 322 (see FIG. 3B).

In various embodiments, the surface of a pad being removed in a pad removal operation employing the gripper socket assembly 204 may make contact with only the first exterior surface 302 of the cylindrical member 208 and may not be in contact with the second and third exterior surfaces 304 and 306. For these embodiments, this may eventually facilitate the separation and removal of the pad from the gripper socket assembly 204 once the pad removal operation has been completed. That is, in the case where the pad is a polishing pad, the pad may have certain adhesive type characteristics that may make it difficult to be separated from any surfaces that it is in contact with (e.g., platen surface). By reducing the exterior surface area of the cylindrical member 208 that actually comes into contact with the pad, the removal of the pad from the gripper socket assembly 204 may be better facilitated. The addition of grooves 316 on the surface of the first exterior surface 302 may further facilitate the removal of the pad from the gripper socket assembly 204 once the pad removal operation has been completed.

In various embodiments, the cylindrical member 208 may be comprised of a material that has sufficient structural integrity to support the various forces that the gripper socket assembly 204 may encounter during, for example, a pad removal operation. In various embodiments, the material may be a metal or an alloy such as steel. In some embodiments, the cylindrical member 208 may further be coated with a non-sticking coating such as Teflon™.

The actual dimensions of the gripper socket assembly 204 may vary depending on several factors including, for example, the environment that the tool 200 will be used in and the size of the pad to be removed. For example, if the tool 200 is to be used in removing a polishing pad from a platen surface, in some embodiments, the gripper socket assembly 204 may be at least 4 inches long and have a diameter of at least 1.5 inches. For example, in one embodiment, the gripper socket assembly 204 may be 8 inches long and may have a diameter of 2 inches.

Figure 3B:
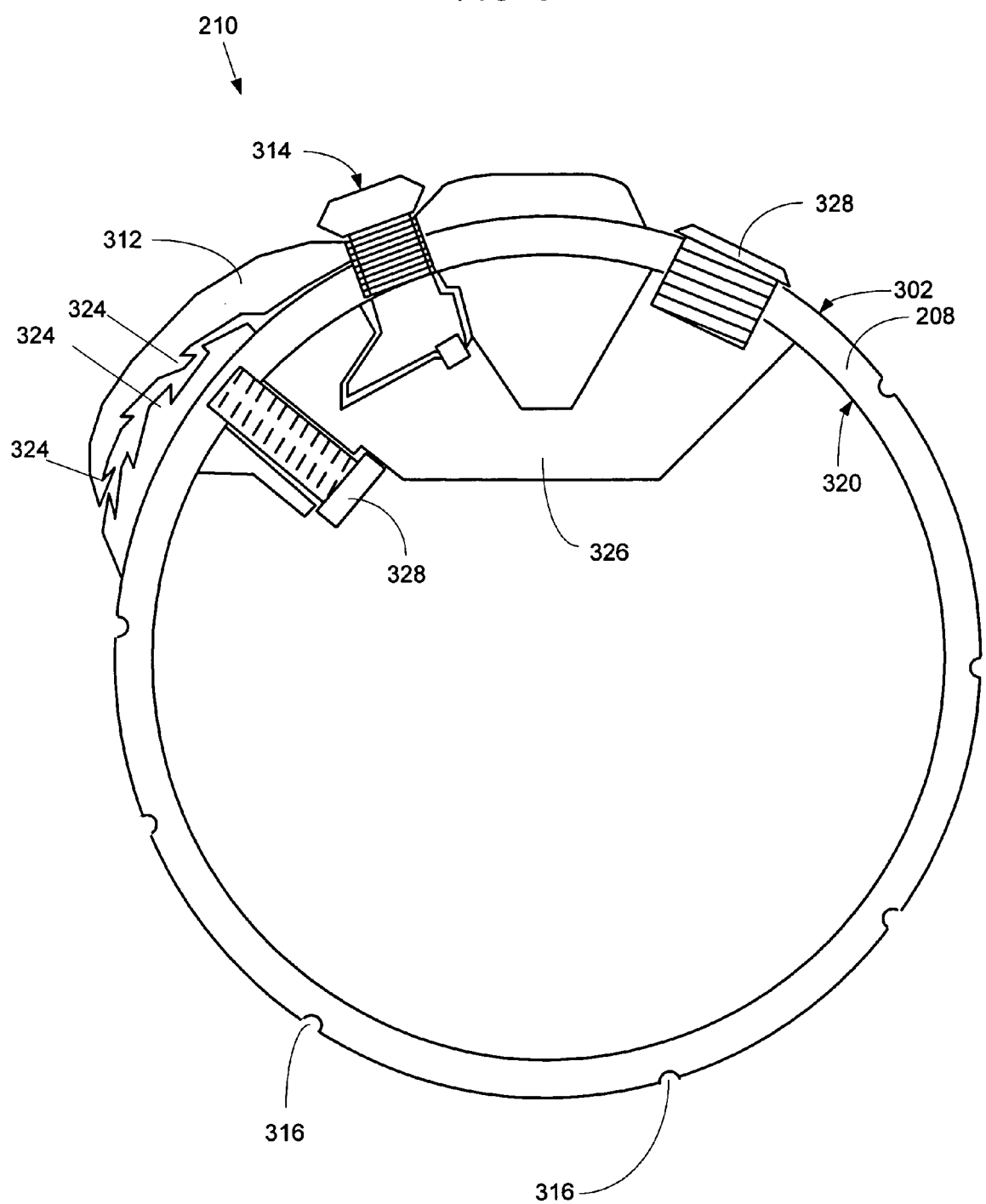
FIG. 3B illustrates a split side view of the gripper socket assembly of FIG. 3A in accordance with some embodiments.

FIG. 3B depicts a cutout side view of the gripper socket assembly of FIG. 3A in accordance with some embodiments. For the embodiments, the gripper socket assembly 204 includes a cylindrical member 208 that has a first exterior surface 302 and an interior surface 320. On the first exterior surface 302 of the cylindrical member 208 is a gripper 210 that is comprised of a lower gripper jaw 322 and a upper gripper jaw 312, each of the jaws having teeth 324. A gripper spring mechanism 314 is also coupled to the first exterior surface 302 of the cylindrical member 208 and to at least the upper gripper jaw 312 so that a constant downward or inward pressure is being applied to the upper gripper jaw 312. In some embodiments, the gripper spring mechanism 314 may be comprised of a double L-latch. An inner assembly 326 is coupled to the interior surface 320 of the cylindrical member 208 by a pair of bolts 328. The inner assembly 326, in various embodiments, may secure the spring mechanism 326 as well as other gripper components (e.g., upper gripper jaw and/or lower gripper jaw). Although not depicted in FIG. 3B, a clutch assembly may be placed within the interior surface of the cylindrical member.

In various embodiments, the gripper socket assembly 204 may be used to remove an adhesively attached pad from an underlying surface by securing at least a portion of the pad between the upper gripper jaw 312 and the lower gripper jaw 322. For the embodiments, the gripper spring mechanism 314 applies a downward force (e.g., towards the lower gripper jaw 322) to the upper gripper jaw 312. The teeth 324 on each of the upper and lower gripper jaws 312 and 322 along with the downward force exerted by the gripper spring mechanism 314 may assure that the portion of the pad that is inserted between the upper and lower gripper jaws 312 and 322 is securely attached to the gripper socket assembly 204.

FIG. 3C is a side view of the gripper socket assembly of FIG. 3A in accordance with some embodiments. For the embodiments, the first exterior surface 302 is defined by a diameter that is greater than the diameter of the second exterior surface 304. Similarly, the second exterior surface 304 is defined by a diameter that is greater than the third exterior surface 304. All three exterior surfaces are part of the cylindrical member 208.

Figure 3D:
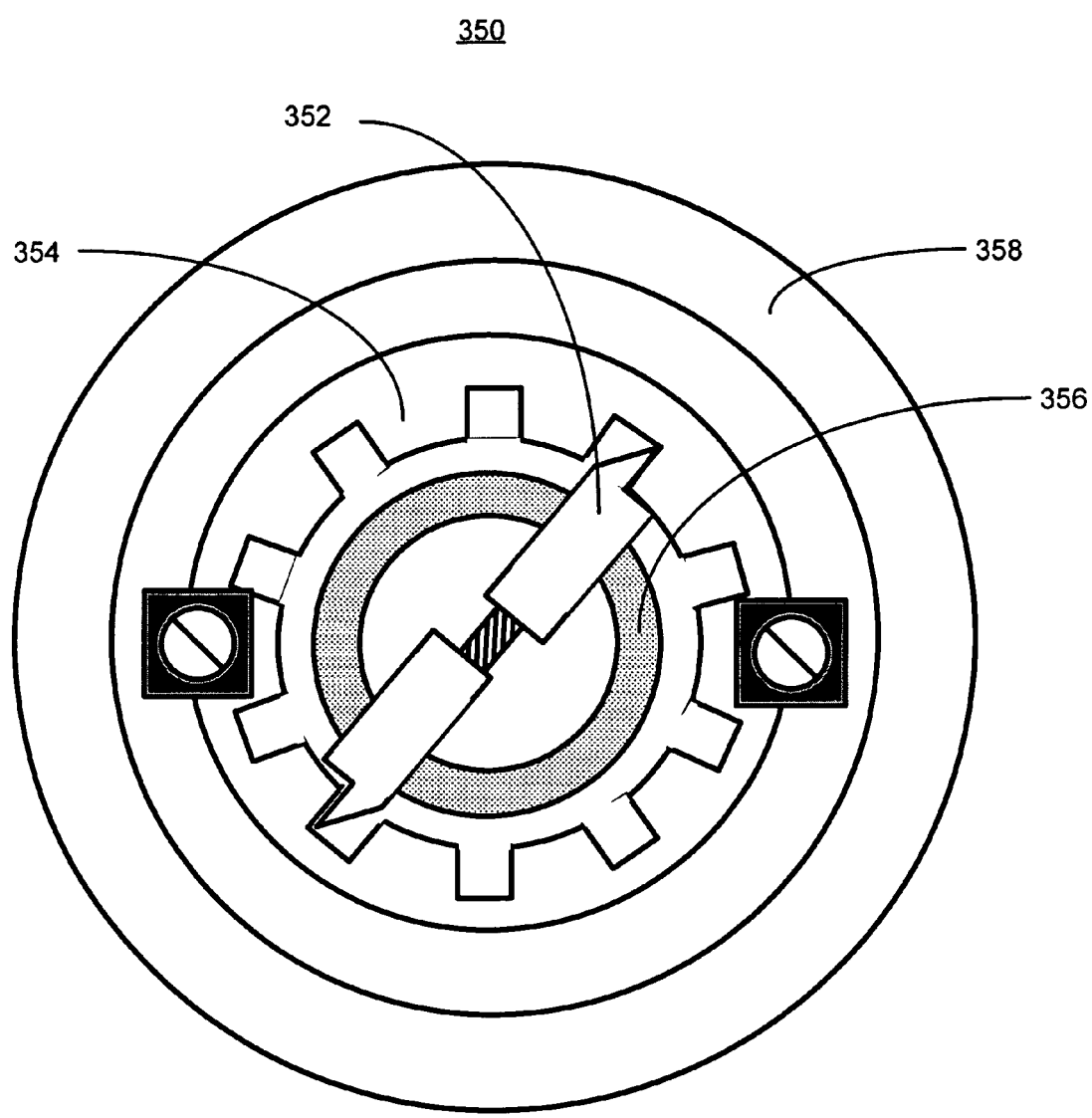
FIG. 3D illustrates a clutch assembly in accordance with some embodiments.

Various types of clutch assemblies may be housed within the cylindrical member 208 in various embodiments. FIG. 3D depicts a cutout view of a clutch assembly that may be housed within the cylindrical member 208 of FIGS. 3A and 3B in accordance with some embodiments. For the embodiments, the clutch assembly 350 includes clutch levers 352, notched-pulley 354, bushing 356 and pad puller vertical x-section 358. In various embodiments, the tips of the clutch levers 352, which may be attached to the main shaft of the gripper socket assembly 204, may fall into the notches of the notched-pulley 354. The notched-pulley 354, which is attached to the body of the gripper socket assembly 204, may further lock the shaft to the notched-pulley 504 in one direction of rotation. However, if rotated in the opposite direction, the shaft (e.g., tips of the clutch levers 352) may come out of the notches of the notched-pulley 354 due to the curved tip design disengaging the shaft from the body of the gripper socket assembly 204. Note that in various other embodiments, the gripper socket assembly 204 may not include a clutch assembly. That is, for these embodiments, a handle portion or a motor may be coupled directly or indirectly to the cylindrical member 208 without coupling through a clutch assembly.

FIG. 4 depicts the tool of FIG. 2 being used in an operation to remove a pad from an underlying surface in accordance with some embodiments. For the embodiments, the tool 200 includes a tool handle 203 and a gripper socket assembly 204 with a gripper 210. The gripper socket assembly 204 may be placed at the edge of a pad 402 that may be adhesively attached to an underlying surface 404. In various embodiments, the pad 402 may be a polishing pad and the underlying surface 404 may be the surface of a platen. The edge of the pad 402 being removed has been inserted into the gripper 210 thus securing at least a portion of the pad 402 to the gripper socket assembly 204. A rotating torquing motion may be applied to the handle 203, which may result in the gripper socket assembly 204 being rotated. As the gripper socket assembly 204 rotates, the pad 402 is wrapped around the gripper socket assembly 204. After removing the pad 402 from the underlying surface 404, the pad 402 may be disposed of by, for example, unwrapping and separating the pad 402 from the gripper socket assembly 204.

FIG. 5A depicts a gripper socket assembly with a plurality of grippers in accordance with some embodiments. For the embodiments, the gripper socket assembly 502 includes three grippers 504, 506 and 508 on a first exterior surface 510 of the cylindrical member 512. The cylindrical member 512 is comprised of the first exterior surface 510 and a second exterior surface 514, the second exterior surface 514 being defined by a diameter smaller than the diameter that defines the first exterior surface 510. As before, in various other embodiments, the cylindrical member 512 may comprise of only a single exterior surface with a constant or a varying diameter through the length of the cylindrical member 512. In yet other embodiments, the cylindrical member 512 may include more than two exterior surfaces defined by different diameters. In still other embodiments, the cylindrical member 512 may have one or more exterior surfaces defined by tapered or varying diameters.

In various embodiments, the grippers 504, 506, and 508 may be offset as depicted in FIG. 5A. That is, for these embodiments, the pads that may be removed using the gripper socket assembly 502 may have irregular shapes. For example, the pads may have circular shapes as indicated by ref. 516. As a result, in these embodiments, one or more of the grippers, in this case, grippers 504 and 508 may be offset to accommodate the shape of the pad that may be removed using the gripper socket assembly 502.

FIG. 5B depicts a gripper socket assembly with a single large gripper in accordance with some embodiments. For the embodiments, the gripper socket assembly 520 includes a cylindrical member 512 having a first exterior surface 510 and a second exterior surface 514, the first exterior surface 510 being defined by a diameter that is larger than the diameter that defines the second exterior surface 514. The gripper socket assembly 520 further includes a large gripper 522 that substantially extends laterally from one lateral end of the first exterior surface 510 to the other lateral end of the first exterior surface 510. Note that although in this embodiment the cylindrical member 516 is depicted as having two distinct surfaces (i.e., first and second exterior surfaces 510 and 514), in other embodiments, the cylindrical member 512 may be comprised of a single exterior surface or more than two exterior surfaces. Further, for these embodiments, the exterior surfaces of the cylindrical member 512 may have a constant or a varying diameter.

Figure 6:
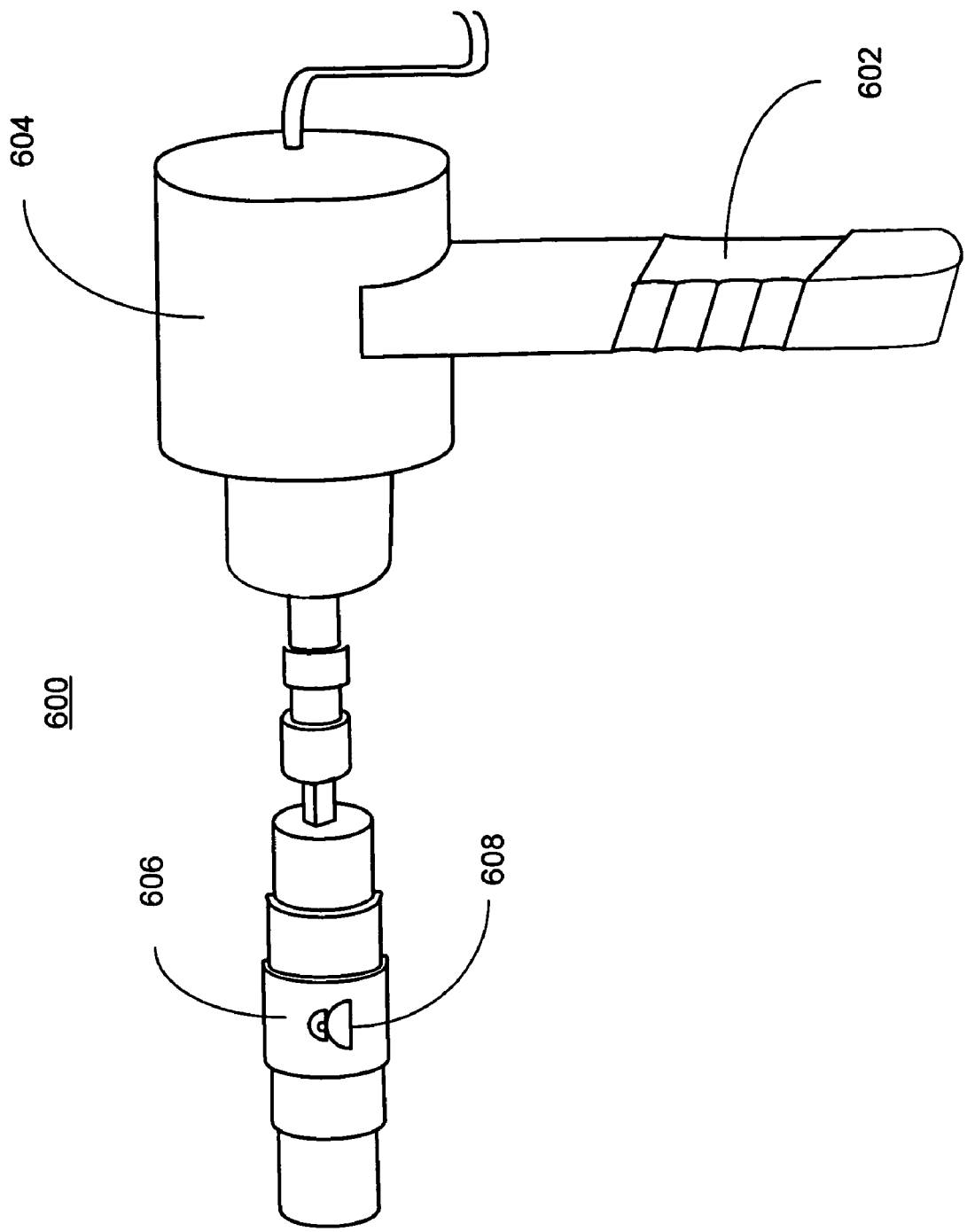
FIG. 6 illustrates a motorized tool that includes a gripper socket assembly in accordance with some embodiments.

FIG. 6 depicts a motorized hand tool with a gripper socket assembly in accordance with some embodiments. For the embodiments, the tool 600 includes a handle 602, a motor 604 coupled to the handle 602, and a gripper socket assembly 606 that is coupled to the motor 604. In various embodiments, the motor 604 may be an electric motor.

Figure 7:
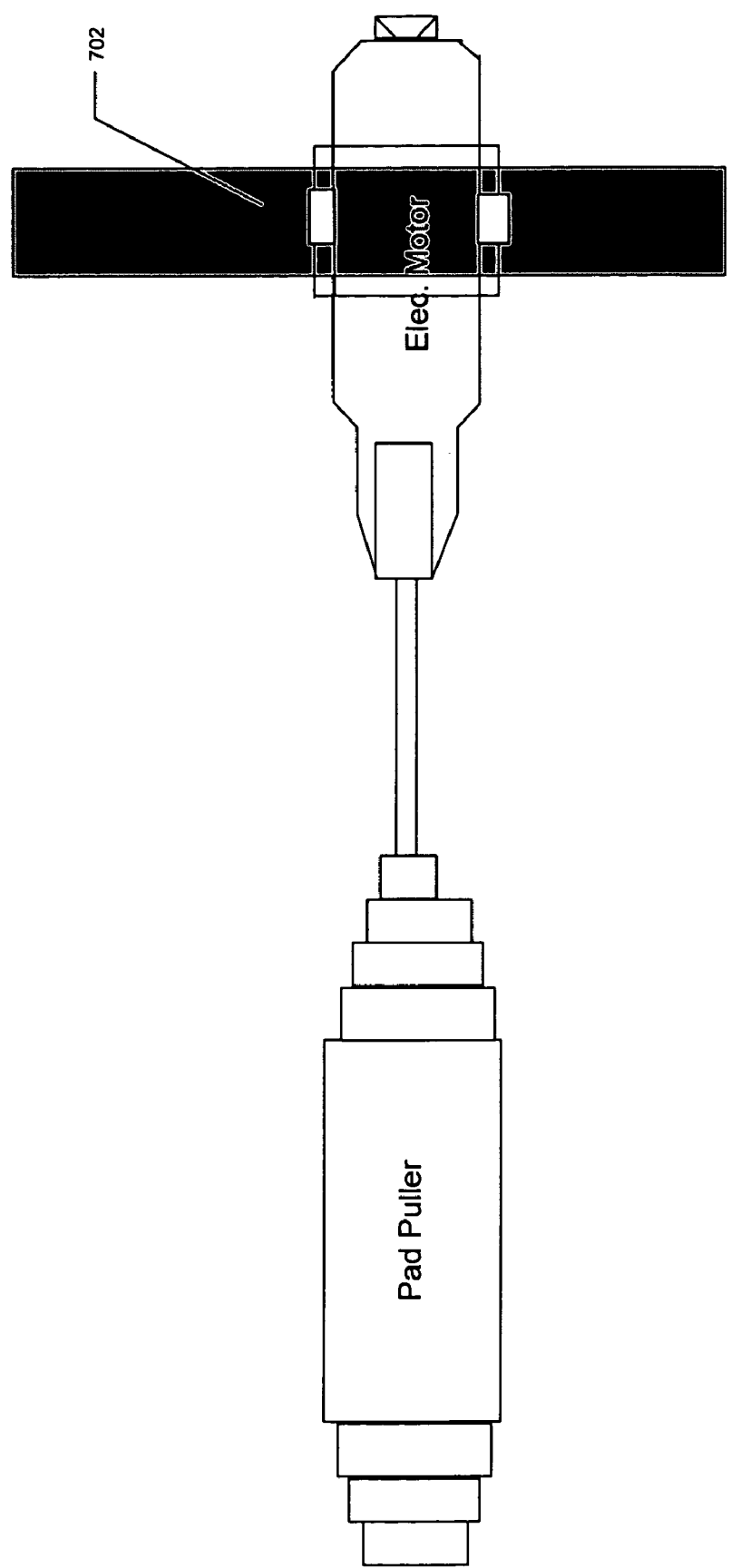
FIG. 7 illustrates a motorized tool that includes a gripper socket assembly and an anchor assembly in accordance with some embodiments.

In various embodiments, the tool 600 may further include an anchor assembly as depicted in FIG. 7. The anchor assembly 702 may be used in order to prevent the motor itself from rotating rather than facilitating rotation of the gripper socket assembly.

Although the gripper 210 in the above embodiments is depicted as having a specific design that includes an upper and a lower jaw, in other embodiments, the gripper may have a completely different design. For example, in some embodiments the gripper may comprise of multiple but smaller grippers or contain a single use adhesive assisted gripper.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the embodiments of the present invention. Therefore, it is manifestly intended that this invention be limited only by the claims.

What is claimed is:

1. A socket apparatus, comprising:
   a cylindrical member of a socket having a first exterior surface and an attachment component to couple with at least a portion of a hand tool;
   a gripper disposed on the first exterior surface of the cylindrical member, the gripper adapted to grip at least a portion of a pad;
   wherein the cylindrical member comprises a second exterior surface, the second exterior surface defined by a diameter smaller than a diameter defining the first exterior surface; and
   wherein the gripper comprises a gripper jaw having teeth adapted to secure said pad.

2. The socket apparatus of claim 1, wherein the gripper further comprises a spring mechanism coupled to the gripper jaw.

3. The socket apparatus of claim 1, wherein the first exterior surface comprises a groove.

4. The socket apparatus of claim 1, wherein the gripper is adapted to grip at least a portion of a chemical mechanical polishing (OMP) pad.

5. The socket apparatus of claim 1, wherein the gripper is adapted to grip at least a portion of an adhesively attached pad.

6. The socket apparatus of claim 1, wherein the gripper is adapted to grip at least a portion of a chemical mechanical polishing (CMP) pad adhesively attached to a surface of a platen.

7. The socket apparatus of claim 1, further comprising a clutch assembly housed within an interior surface of the cylindrical member.

8. The socket apparatus of claim 1, wherein said attachment component is adapted to couple to a handle portion of the hand tool.

9. The socket apparatus of claim 8, wherein said attachment component is further adapted to couple with an arm of the handle portion of the hand tool.

10. The socket apparatus of claim 8, wherein the attachment component is a wrench attachment piece or a hole.

11. The socket apparatus of claim 1, wherein the attachment component is coupled to a clutch assembly housed within the cylindrical member.

12. The socket apparatus of claim 1, wherein the attachment component is adapted to couple with at least the portion of the hand tool, wherein the hand tool comprise a motor.

13. The socket apparatus of claim 3, wherein the groove is parallel to a cylindrical axis of the cylindrical member of the socket.

* * * * *

UNITED STATES PATENT AND TRADEMARK OFFICE
CERTIFICATE OF CORRECTION

| | | |
|---|---|---|
| PATENT NO. | : 7,222,403 B2 | Page 1 of 1 |
| APPLICATION NO. | : 10/928862 | |
| DATED | : May 29, 2007 | |
| INVENTOR(S) | : Omid Tehrani | |

It is certified that error appears in the above-identified patent and that said Letters Patent is hereby corrected as shown below:

Column 8

Line 23, "...(OMP)..." should read --...(CMP)...--.

Line 48, "...hand tool comprise..." should read --...hand tool comprises...--.

Signed and Sealed this

Twenty-third Day of September, 2008

JON W. DUDAS
*Director of the United States Patent and Trademark Office*